(12) United States Patent
Liu

(10) Patent No.: US 8,076,663 B2
(45) Date of Patent: Dec. 13, 2011

(54) PHASE CHANGE MEMORY STRUCTURES

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/797,315

(22) Filed: Jun. 9, 2010

(65) Prior Publication Data

US 2010/0264395 A1   Oct. 21, 2010

Related U.S. Application Data

(62) Division of application No. 12/186,992, filed on Aug. 6, 2008, now Pat. No. 7,754,522.

(51) Int. Cl.
*H01L 47/00* (2006.01)

(52) U.S. Cl. ........ 257/2; 257/3; 257/4; 438/95; 438/530

(58) Field of Classification Search .................. 257/2, 3, 257/4, 29, E45.001; 438/95, 530, 540
See application file for complete search history.

(56) References Cited

U.S. PATENT DOCUMENTS

| | | | |
|---|---|---|---|
| 6,261,908 B1 | 7/2001 | Hause et al. | |
| 6,746,892 B2 | 6/2004 | Lee et al. | |
| 6,818,481 B2 | 11/2004 | Moore et al. | |
| 7,368,802 B2 | 5/2008 | Hayakawa | |
| 7,391,050 B2 | 6/2008 | Happ | |
| 7,397,077 B2 | 7/2008 | Nickel | |
| 7,566,643 B2 | 7/2009 | Czubatyi et al. | |
| 7,714,315 B2 * | 5/2010 | Happ et al. ........................ | 257/5 |
| 2005/0032269 A1 | 2/2005 | Xu et al. | |
| 2006/0077706 A1 * | 4/2006 | Li et al. .......................... | 365/163 |
| 2007/0181932 A1 | 8/2007 | Happ et al. | |
| 2007/0184613 A1 | 8/2007 | Kim et al. | |
| 2007/0246699 A1 | 10/2007 | Lung | |
| 2007/0268742 A1 | 11/2007 | Liu | |
| 2007/0292985 A1 * | 12/2007 | Zhang ............................. | 438/95 |
| 2008/0019097 A1 | 1/2008 | Zhang et al. | |
| 2008/0101111 A1 | 5/2008 | Chang | |
| 2008/0121862 A1 | 5/2008 | Liu | |
| 2008/0165574 A1 | 7/2008 | Kim et al. | |
| 2009/0101883 A1 * | 4/2009 | Lai et al. .......................... | 257/3 |

FOREIGN PATENT DOCUMENTS

| | | |
|---|---|---|
| KR | 10-0612913 B1 | 8/2006 |
| KR | 10-2006-0100280 A | 9/2006 |
| KR | 10-0830060 B1 | 5/2008 |
| KR | 10-0809341 B1 | 6/2008 |

OTHER PUBLICATIONS

Hwang, Y.N., et al. "Full Integration and Reliability Evaluation of Phase-change RAM Based on 0.24 µm CMOS Technologies," 2003 Symposium on VLSI Technology Digest of Technical Papers, pp. 173-174. (2003).
International Search Report and Written Opinion for related PCT Application PCT/US2009/004336, dated Feb. 10, 2010 (11 pgs.).

* cited by examiner

*Primary Examiner* — Phuc Dang
(74) *Attorney, Agent, or Firm* — Brooks, Cameron & Huebsch, PLLC

(57) ABSTRACT

Methods, devices, and systems associated with phase change memory structures are described herein. One or more embodiments of the present disclosure can reduce thermal crosstalk associated with phase change memory cells, which can provide various benefits including improved data reliability and retention and decreased read and/or write times, among various other benefits. One or more embodiments can reduce the number of processing steps associated with providing local interconnects to phase change memory arrays.

18 Claims, 10 Drawing Sheets

PHASE CHANGE MEMORY STRUCTURES

CROSS-REFERENCE TO RELATED APPLICATION

This application is a Divisional of U.S. application Ser. No. 12/186,992, filed Aug. 6, 2008, now U.S. Pat. No. 7,754,522 issued Jul. 13, 2010, the specification of which is incorporated herein by reference.

TECHNICAL FIELD

The present disclosure relates generally to semiconductor memory devices and methods, and more particularly, to phase change memory structures and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among other types of memory.

Resistance variable memory devices, such as PCRAM devices, can include a structural phase change material such as a chalcogenide alloy, for instance, which can be programmed into different resistivity states to store data. The phase change memory cells are nonvolatile and the particular data stored in a phase change memory cell can be read by sensing the cell's resistance, e.g., by sensing current and/or voltage variations based on the resistance of the phase change material.

In cases in which the resistance variable memory device includes a chalcogenide alloy, the chalcogenide alloy can exhibit a reversible structural phase change, e.g., from amorphous to crystalline. A small volume of the chalcogenide alloy can be integrated into a circuit that can allow the cell to act as a fast switching programmable resistor. This programmable resistor can exhibit greater than 40 times the dynamic range of resistivity between the crystalline state (low resistivity) and the amorphous state (high resistivity), and is also capable of exhibiting multiple intermediate states that allow multi-bit storage in each cell. That is, resistance variable memories may achieve multi-level cell (MLC) functionality via programming of memory cells to one of a number of different resistance levels.

Thermal sensitivity of phase change memory cells can lead to data retention and/or accuracy issues associated with programming and/or reading the data state of the cells. For instance, increases in temperature can alter the structural phase of a cell, which can result in an altering of the programmed data state of a cell due to a resistance change associated with the phase change material of the memory cell. As such, unintentional and/or undesirable temperature fluctuations can lead to data read errors.

DETAILED DESCRIPTION

Figure 1:
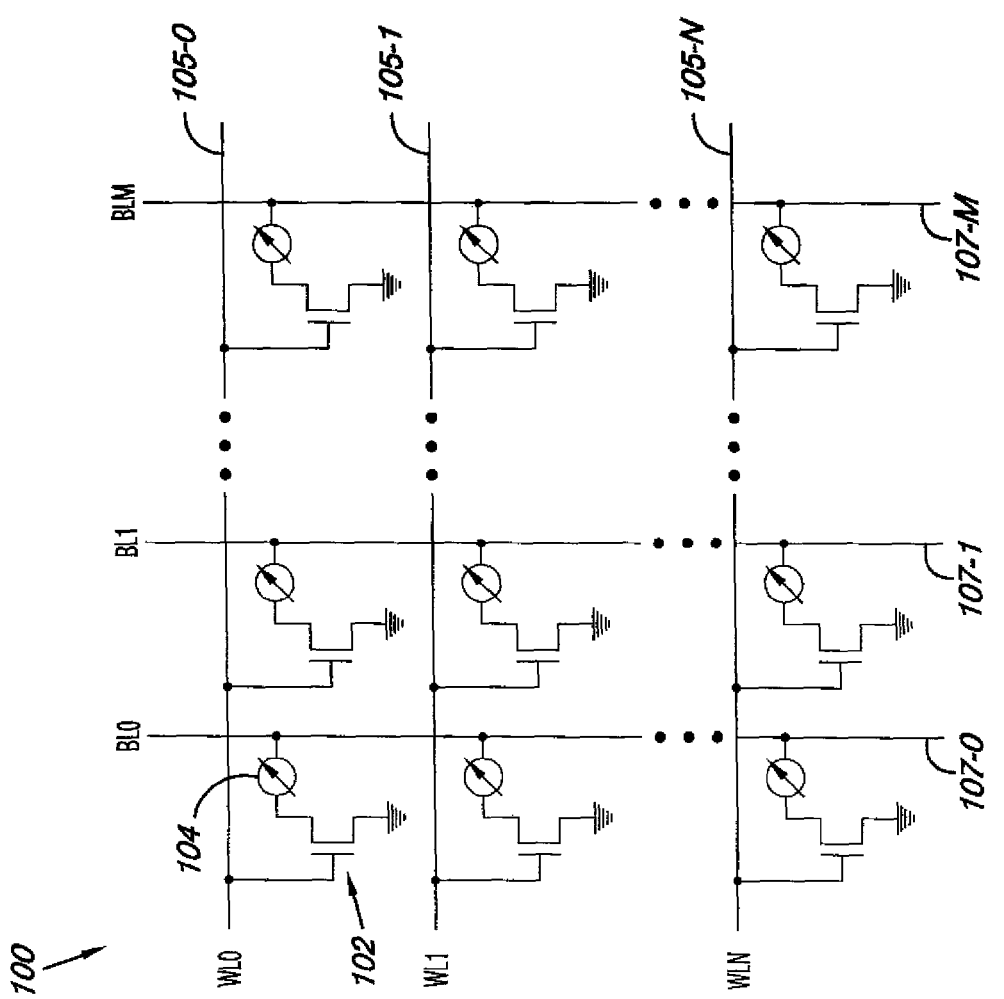
FIG. 1 is a schematic of a portion of a phase change memory array that can be used in accordance with one or more embodiments of the present disclosure.

Methods, devices, and systems associated with phase change memory structures are described herein. One or more embodiments of the present disclosure can reduce thermal crosstalk associated with phase change memory cells, which can provide various benefits including improved data reliability and retention and increased read and/or write times, among various other benefits. One or more embodiments can reduce the number of processing steps associated with providing local interconnects to phase change memory arrays.

In one or more embodiments, a method for forming a phase change memory structure includes forming a first stack structure including a phase change material between a bottom electrode and a top electrode, forming a second stack structure a distance from the first stack structure, and depositing a thermally conductive material in a gap between the first stack structure and the second stack structure. In various embodiments, the thermally conductive material provides a heat sink which can reduce the thermal crosstalk between adjacent phase change memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

As used in this disclosure, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

FIG. 1 is a schematic of a portion of a phase change memory array 100 that can be used in accordance with one or more embodiments of the present disclosure. In the embodiment illustrated in FIG. 1, the memory array 100 includes a number of phase change memory cells each having an associated access device 102 and resistance variable element 104, e.g., a phase change material 104. The access devices 102 can be operated, e.g., turned on/off, to access the memory cells in order to perform operations such as data programming, e.g., writing, and/or data reading operations on the resistance variable elements 104.

In the embodiment illustrated in FIG. 1, the access devices 102 are metal oxide semiconductor field effect transistors (MOSFETs). As shown in FIG. 1, a gate of each MOSFET 102 associated with each memory cell is coupled to one of a number of access lines 105-0 (WL0), 105-1 (WL1), . . . , 105-N (WLN), i.e., each access line 105-0, 105-1, . . . , 105-N is coupled to a row of phase change memory cells. The access lines 105-0, 105-1, . . . , 105-N may be referred to herein as "word lines." The designator "N" is used to indicate that a memory array can include a number of access lines. The resistance variable elements 104 can be a phase change chalcogenide alloy such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In the embodiment illustrated in FIG. 1, each resistance variable element 104 is coupled to one of a number of data lines 107-0 (BL0), 107-1 (BL1), . . . , 107-M (BLM), i.e., each data line 107-0, 107-1, . . . , 107-M is coupled to a column of phase change memory cells. The data lines 107-0, 107-1, . . . , 107-M may be referred to herein as "bit lines" or "sense lines." The designator "M" is used to indicate that a memory array can include a number of data lines. For ease of addressing in the digital environment, the number of word lines 105-1, . . . , 105-N and the number of bit lines 107-1, . . . , 107-M can each be some power of two, e.g., 256 word lines by 4,096 bit lines. However, embodiments are not limited to particular numbers of word lines and/or bit lines.

In operation, appropriate voltage and/or current signals, e.g., pulses, can be applied to the bit lines 107-0, 107-1, . . . , 107-M and word lines 105-0, 105-1, . . . , 105-N in order to program data to and/or read data from the phase change memory cells of the array 100. As an example, the data stored by a phase change memory cell of array 100 can be determined by turning on an access device, e.g., 102, and sensing a current passing through the phase change element, e.g., 104. The current sensed on the bit line associated with the memory cell being read, e.g., bit line 107-0, 107-1, . . . 107-M, corresponds to a resistance level of the phase change element 104, which in turn corresponds to a particular data value, e.g., a binary value such as 1, 0, 001, 111, 1011 etc.

Embodiments of the present disclosure are not limited to the example array 100 illustrated in FIG. 1. For example, as one of ordinary skill in the art will appreciate, the access device 102 associated with a particular memory cell can be a device other than a MOSFET. In some embodiments, the access device 102 can be a bipolar junction transistor (BJT) or a diode, among other types of access devices. An example of an array in which the access device is a diode is described below in connection with FIG. 2. Also, a memory array, e.g., 100, can have an architecture other than that illustrated in FIG. 1, as will be understood by one of ordinary skill in the art.

Figure 2:
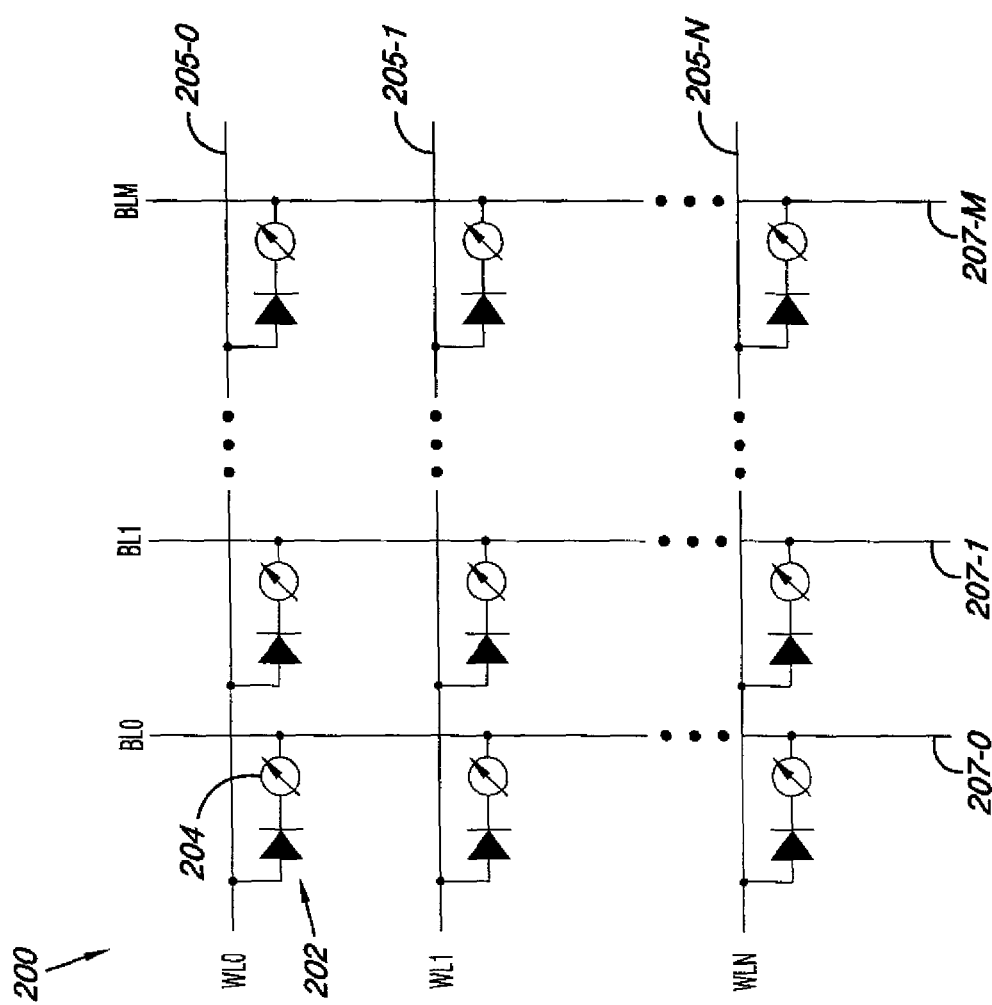
FIG. 2 is a schematic of a portion of a phase change memory array that can be used in accordance with one or more embodiments of the present disclosure.

FIG. 2 is a schematic of a portion of a phase change memory array 200 that can be used in accordance with one or more embodiments of the present disclosure. In the embodiment illustrated in FIG. 2, the access device 202 associated with the phase change memory cells of array 200 is a diode 202. The diode 202 can be a diode such as a p-n diode, a Zener diode, or a Schottky diode, among various other types of diodes.

In operation, appropriate voltage and/or current signals, e.g., pulses, can be applied to the bit lines 207-0, 207-1, . . . , 207-M and word lines 205-0, 205-1, . . . , 205-N in order to program data to and/or read data from the phase change memory cells of the array 200. As an example, the data stored by a phase change memory cell of array 200 can be determined by turning on a diode access device, e.g., 202, and sensing a current passing through the phase change element, e.g., 204. The current sensed on the bit line associated with the memory cell being read, e.g., bit line 207-0, 207-1, . . . , 207-M, corresponds to a resistance level of the phase change element 204, which in turn corresponds to a particular data value, e.g., a binary value such as 1, 0, 001, 111, 1011, etc.

As one of ordinary skill in the art will appreciate, the phase change memory array 100 illustrated in FIG. 1 and the phase change memory array 200 illustrated in FIG. 2 can be coupled to programming, e.g., write, circuitry and/or sensing, e.g., read, circuitry (not shown in FIGS. 1 and 2). For instance, the arrays 100 and/or 200 can be coupled to write and/or read circuitry as described below in connection with FIG. 7.

Figure 3:
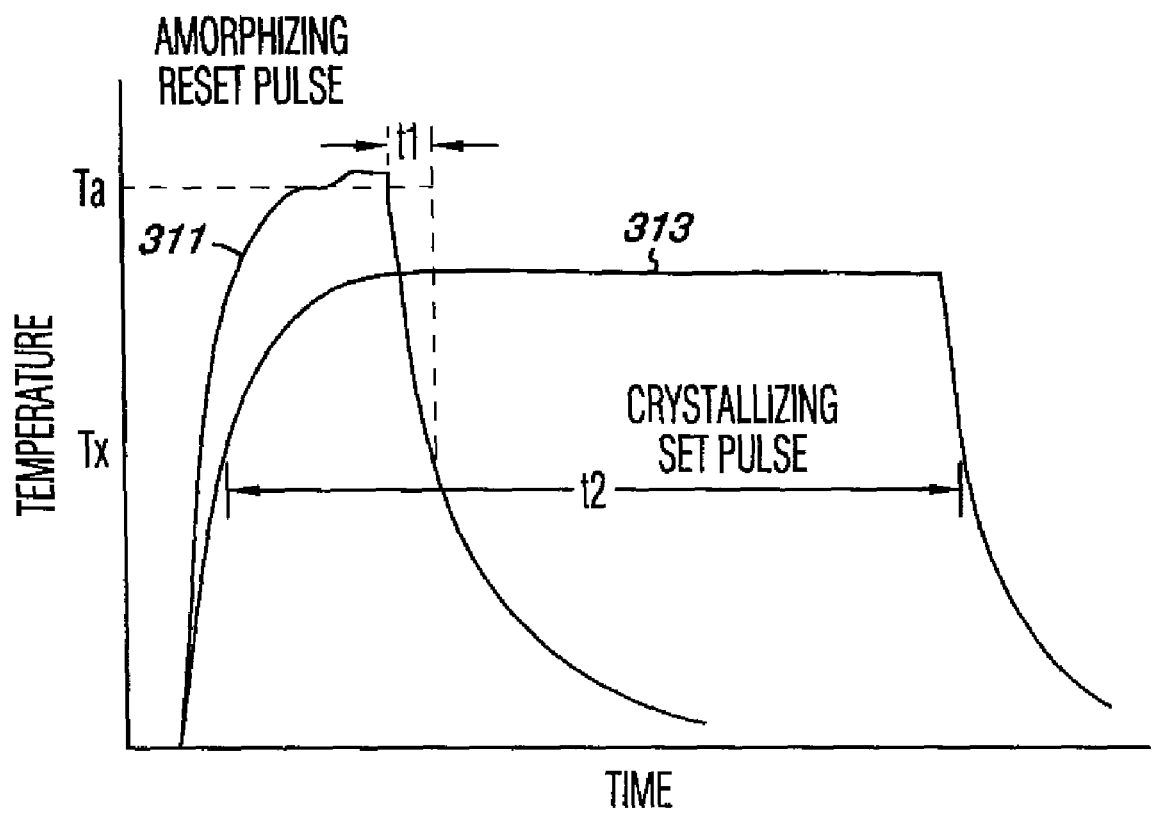
FIG. 3 illustrates an example of pulses that can be used to program phase change memory cells in accordance with one or more embodiments of the present disclosure.

FIG. 3 illustrates an example of pulses that can be used to program phase change memory cells in accordance with one or more embodiments of the present disclosure. In FIG. 3, the pulse 311 represents an amorphizing (reset) pulse, e.g., a pulse used to place one or more phase change memory cells in an amorphous (high resistivity) state. The pulse 313 represents a crystallizing (set) pulse, e.g., a pulse used to place one or more phase change memory cells in a crystalline (low resistivity) state. The reset pulse 311 and the set pulse 313 can be applied to a particular memory cell in order to alter the resistance of the phase change element, e.g., phase change element 104 shown in FIG. 1 or phase change element 204 shown in FIG. 2, by raising/lowering the temperature of the phase change material corresponding to the cell in a manner such that the resistance of the cell is changed, e.g., programmed, to a value that corresponds to a particular desired data state.

As one of ordinary skill in the art will appreciate, a reset pulse such as reset pulse 311 can be used to place the phase change material, e.g., phase change element 104 shown in FIG. 1 or 204 shown in FIG. 2, or a portion thereof, in a relatively amorphous state corresponding to a relatively high resistance value, e.g., about 100 kiloohm to 1 megaohm. For instance, in the example illustrated in FIG. 3, the reset pulse 311 can be used to raise the temperature of the phase change material to a temperature Ta sufficient to melt the phase change material; the phase change material cools over a short time period, i.e., t1, to amorphize the phase change material such that the phase change material does not re-form some portion of its internal crystalline structure. The time t1 can be referred to as a "quenching time."

A set pulse, such as set pulse 313 illustrated in FIG. 3, can be used to raise the temperature of a phase change material above a temperature Tx and maintain the temperature of the phase change material for a time, e.g., t2, sufficient to allow crystallization of the phase change material to occur. As such, the set pulse 313 can place the phase change material in a relatively crystalline state corresponding to a relatively low resistance value, e.g., about 1 kiloohm to 10 kiloohm, for instance.

Embodiments of the present disclosure are not limited to the reset and/or set pulses illustrated in the example shown in FIG. 3. As an example, one or more embodiments of the present disclosure can provide a phase change memory structure which can shorten the quench time, e.g., t1 shown in FIG. 3, associated with a reset pulse, e.g., 311. For instance, various embodiments can increase the quench rate associated with a reset pulse by providing a heat sink between adjacent cells which can quickly and efficiently dissipate heat generated by a reset pulse such as pulse 311 shown in FIG. 3. Examples of such heat sink regions are described in connection with FIGS. 5A-5C and 6A-6D. One or more phase change memory structures having a heat sink region in accordance with embodiments of the present disclosure can also decrease the melting time associated with a reset pulse, e.g., 311, and/or a set pulse, e.g., 313, which can also decrease cell programming time. As one example, in some embodiments, the time for a reset operation can be about 10 ns.

Figure 4:
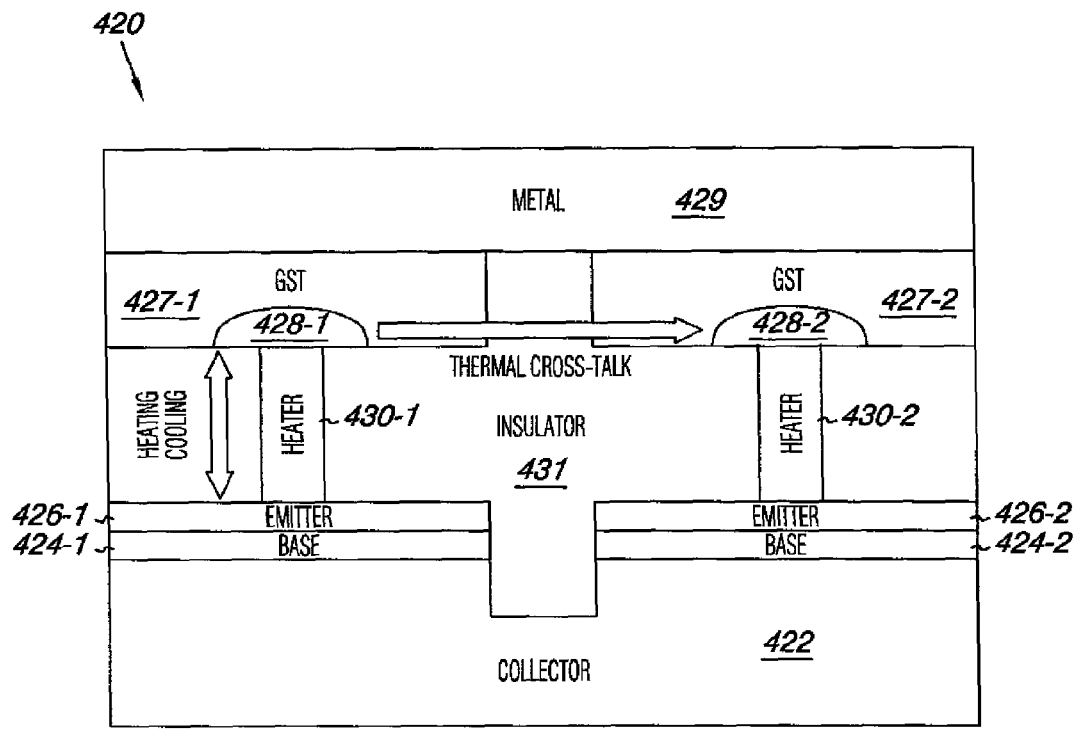
FIG. 4 illustrates a cross-sectional view of a portion of a phase change memory structure.

FIG. 4 illustrates a cross-sectional view of a portion 420 of a phase change memory structure. The example shown in FIG. 4 is used to illustrate thermal interference, e.g., crosstalk, which can occur between adjacent phase change memory cells in an array of cells, e.g., array 100 shown in FIG. 1 or array 200 shown in FIG. 2. Thermal crosstalk between cells can increase the temperature of the phase change material of a particular adjacent cell, which can unintentionally alter the programmed resistance of the adjacent phase change cell. As a result, such thermal crosstalk can result in reduced data reliability, e.g., data read errors. The problem associated with thermal crosstalk between adjacent cells may intensify as the phase change material in and/or around adjacent cells becomes closer as semiconductor device size is scaled.

The example illustrated in FIG. 4 includes a first phase change material 427-1 associated with a first phase change memory cell and a second phase change material 427-2 associated with an adjacent phase change memory cell. As shown in FIG. 4, in this example, the phase change material 427-1 and 427-2 is a GST material. However, embodiments of the present disclosure are not limited to a particular type of phase change material.

In the example illustrated in FIG. 4, the access device associated with a first phase change memory cell includes collector 422, base 424-1, and emitter 426-1, while the access device associated with the adjacent cell includes collector 422, base 424-2, and emitter 426-2. That is, the access devices, which can be coupled to word lines in a phase change memory array, are bipolar junction transistors (Ms), in this example.

The first phase change memory cell includes a bottom electrode 430-1 and the adjacent phase change memory cell includes a bottom electrode 430-2. As shown in the example illustrated in FIG. 4, the bottom electrodes 430-1 and 430-2 of the adjacent cells and the phase change material 427-1 and 427-2 of the adjacent cells are separated by an insulator material 431. In various previous approaches, and in the example shown in FIG. 4, the insulator 431 is a thermally non-conductive insulating material such as silicon dioxide or other thermally non-conductive insulating material. Such thermally non-conductive insulating materials are less effective for transferring, e.g., dissipating, heat than thermally conductive insulating materials. For instance, thermally non-conductive insulating materials, e.g., 431, dissipate heat generated by a particular cell at a slower rate than thermally conductive insulating materials, e.g., thermally conductive insulating materials such as silicon nitride (SiN), aluminum nitride (AlN), diamond-like-carbon (DLC), and various carbon-carbon (C-C) composites, among others. In various embodiments, the thermally conductive material can be a carbon nanotube material.

The bottom electrodes 430-1 and 430-2 can be referred to as "heaters," as shown in FIG. 4. In operation, current can pass between the bottom electrodes 430-1 and 430-2 and a top electrode, e.g., metal layer 429 in this example, through the respective GST material 427-1 and 427-2. The heat generated by the current between the top and bottom electrodes can alter the structural phase of a portion 428-1 and/or portion 428-2 of the respective phase change materials 427-1 and 427-2, which can alter the resistance of the cell. In operation, the phase change material of a particular cell, e.g., 427-1, including the corresponding resistance-alterable portion, e.g., 428-1, can act as a series resistance between the top and bottom electrodes, e.g., metal layer 429 and electrode 430-1, respectively. In this manner, and as noted above, the resistance of the phase change material of a particular cell can be programmed to a particular level which can correspond to a particular stored data state of the cell.

However, as phase change memory devices become smaller, e.g., to reduce size and/or increase density, the distance between the phase change materials, e.g., 427-1 and 427-2, of adjacent cells and/or the distance between the bottom electrodes, e.g., 430-1 and 430-2, of adjacent cells can decrease. As such, the thermal crosstalk between adjacent cells can become significant; it can lead to unintentional and/or undesirable effects such as data read errors due to resistance changes in adjacent cells. For instance, the heat generated by heating the phase change material 427-1 can result in altering the phase, e.g., crystallizing, a portion of the phase change material 427-2 of the adjacent cell, when it is in the amorphous state, which can alter the resistance associated with the adjacent cell.

Various embodiments of the present disclosure can reduce the effects of thermal crosstalk between adjacent phase change memory cells by providing an efficient heat dissipation region, e.g. heat sink, between and/or around adjacent phase change memory cells. In one or more embodiments, the heat sink region can be comprised of a thermally conductive material. In one or more embodiments, and as described further below in connection with FIGS. 5A-5C, the heat sink region can be comprised of a thermally conductive dielectric material or a combination of thermally conductive dielectric materials such as SiN, DLC, AlN, carbon nanotubes, and/or various C-C composites, to name a few.

In one or more embodiments, and as described further below in connection with FIGS. 6A-6D, the heat sink region can be used as a local interconnect between memory cells. In such embodiments, the heat sink region can be comprised of an electrically conductive material such as a metal, which can serve as a local interconnect between various regions of an integrated circuit. For example, the metal heat sink can be used to locally interconnect gate, source, and/or drain regions in circuits and/or can be used to locally interconnect one or more metallization layers to particular structures in an integrated circuit. In various embodiments in which the heat sink region includes an electrically conductive material, the electrically conductive material can also be a thermally conductive material. In such embodiments, the electrically and thermally conductive heat sink region can serve as both a local interconnect and a heat dissipater.

Figure 5A:
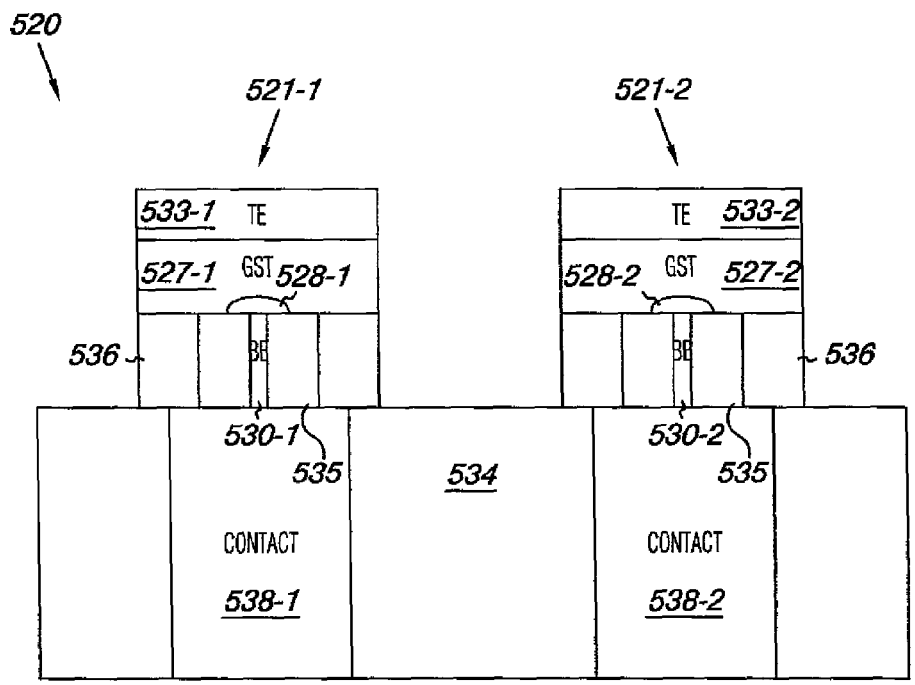
FIGS. 5A-5C are cross-sectional views illustrating formation of a phase change memory structure in accordance with one or more embodiments of the present disclosure.
Figure 5B:
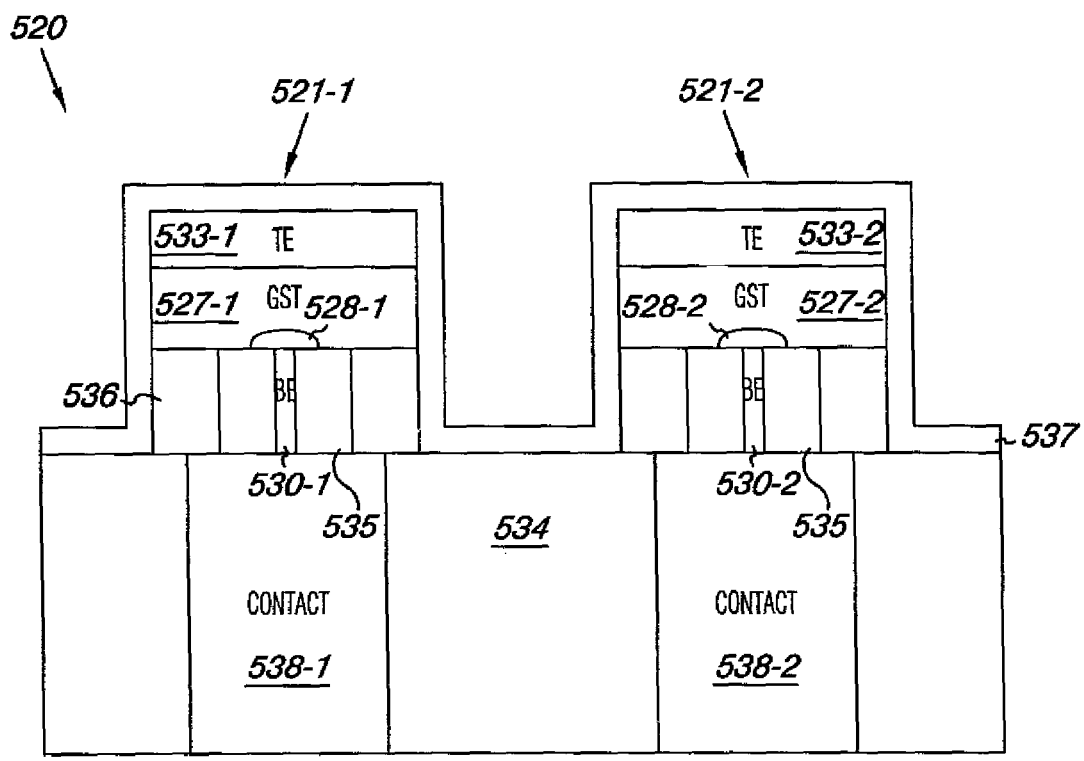
Figure 5C:
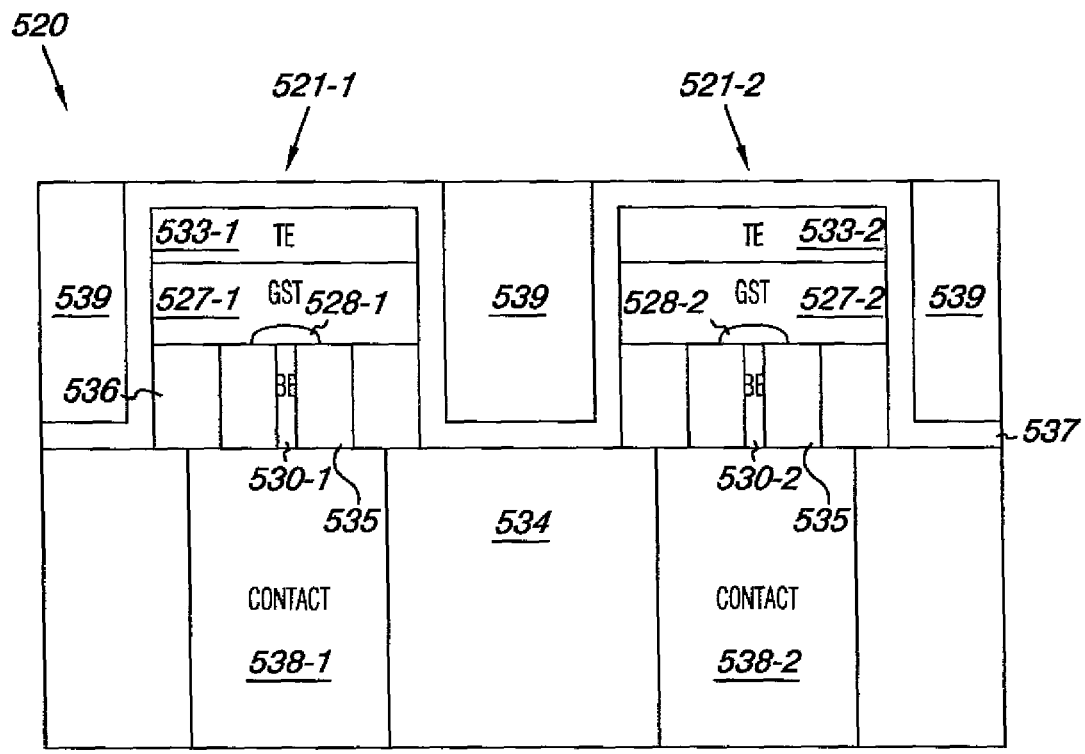

FIGS. 5A-5C are cross-sectional views illustrating formation of a phase change memory structure 520 in accordance with one or more embodiments of the present disclosure. Although not shown in FIGS. 5A-5C, one of ordinary skill in the art will appreciate that the phase change memory structure 520 can be formed on a base semiconductor structure such as a silicon substrate, among various other semiconductor foundations such as SOI, SOS, etc. In the embodiment illustrated in FIGS. 5A-5C, the phase change structure 520 includes a first stack structure 521-1 associated with a first phase change memory cell and a second stack structure 521-2 associated with a second phase change memory cell, e.g., an adjacent phase change memory cell in this example.

FIG. 5A shows phase change structure 520 at a particular stage in a phase change memory device fabrication sequence. In the embodiment illustrated in FIG. 5A, the first stack 521-1 includes a top electrode (TE) 533-1 formed on a layer of phase change material 527-1 (GST in this example), which is formed on a dielectric layer 536. The second stack 521-2 includes a top electrode 533-2 formed on a layer of phase change material 527-2, which is formed on a dielectric layer 536. The separate stacks 521-1 and 521-2 are formed by a masking and etching process through the appropriate layers. The etching can be a dry etch or other suitable process.

As shown in FIG. 5A, the stack 521-1 includes a bottom electrode (BE) 530-1 and the stack 521-2 includes a bottom electrode 530-2. The bottom electrodes 530-1 and 530-2 are formed of electrically conductive material and are connected to conductive contacts 538-1 and 538-2, respectively. The contacts 538-1 and 538-2 can be metal contacts and can be connected to an access device of a phase change memory cell, e.g., a FET, diode, or BJT, among other devices associated with a phase change memory cell.

In one or more embodiments, the phase change structure 520 can be formed by forming a dielectric layer 534 on a substrate (not shown in FIG. 5A). The dielectric layer 534 can be a dielectric oxide layer such as silicon dioxide ($SiO_2$), among others. The contacts 538-1 and 538-2 can be formed in the dielectric layer 534, e.g., via a masking and etching process. A planarization process such as chemical mechanical planarization (CMP) can be used to planarize the surface, e.g., to remove excess layer 534 and expose the contacts 538-1 and 538-2. A dielectric layer 536 can then be formed over the contacts 538-1 and 538-2 and the dielectric layer 534. The dielectric layer 536 can be silicon dioxide or other suitable dielectric material.

In the embodiment illustrated in FIG. 5A, the dielectric layer 536 is masked and etched and then filled with portions 535 of material prior to formation of the bottom electrodes 530-1 and 530-2 therein. However, embodiments are not limited to this example. For instance, in various embodiments, the bottom electrodes 530-1 and 530-2 may be formed directly in dielectric layer 536. That is, in such embodiments, the filler material 535 may not be used in forming the bottom electrodes. Whether the filler material is used can depend on various factors such as the desired width of the electrodes 530-1 and 530-2, among other factors.

After formation of the bottom electrodes 530-1 and 530-2, a layer of phase change material, e.g., a chalcogenide alloy such as GST or other suitable phase change material, is formed on the dielectric layer 536 and a layer of conductive material which will form top electrodes 533-1 and 533-2 is formed over the phase change material layer. As noted above, a masking and etching process can then be used to remove the appropriate portions of structure 520 in order to form the individual stacks 521-1 and 521-2 corresponding to adjacent phase change memory cells. Alternatively, in some embodiments, the stacks 521-1 and 521-2 may be formed by etching less than the entire layer 536 between the stacks 521-1 and 521-2. That is, the stacks 521-1 and 521-2 can be formed without etching all the way to layer 534, in various embodiments.

As illustrated in FIG. 5A, the first stack 521-1 includes phase change material 527-1 located between and connected to the bottom electrode 530-1 and the top electrode 533-1. The second stack 521-2 includes phase change material 527-2 located between and connected to the bottom electrode 530-2 and the top electrode 533-2. In the embodiment shown in FIG. 5A, the phase change materials 527-1 and 527-2 include respective portions 528-1 and 528-2, which can undergo structural phase transitions during operation of the phase change memory cells.

FIG. 5B shows phase change structure 520 at another particular stage in a phase change memory device fabrication sequence. In the embodiment illustrated in FIG. 5B, an encapsulation layer 537 is formed on the structure 520. The encapsulation layer 537 can be a dielectric material, which can be used to electrically insulate the stack 521-1 associated with a first phase change memory cell from the stack 521-2 associated with an adjacent phase change memory cell. As shown in FIG. 5B, the layer 537 can form sidewalls on the stacks 521-1 and 521-2. The layer 537 can be an insulating material such as silicon nitride (SiN), polyimide, or fluorinated silicon dioxide, among other insulators, and can be deposited via a process such as chemical vapor deposition (CVD). However, embodiments are not limited to particular materials or to particular formation, e.g., deposition and/or growth, techniques.

FIG. 5C shows the phase change structure 520 at another particular stage in a phase change memory device fabrication sequence. In FIG. 5C, the structure 520 includes a thermally conductive material 539 deposited between adjacent phase change memory cells, e.g., between adjacent stack structures 521-1 and 521-2. In one or more embodiments of the present disclosure, the thermally conductive material 539 provides a heat dissipation region, e.g., a heat sink, between and/or around adjacent phase change memory cells. The heat sink region 539 can quickly and efficiently dissipate heat generated by a particular cell, which can provide benefits such as reducing thermal crosstalk between adjacent cells. Reduction in thermal crosstalk between phase change memory cells can include benefits such as improving data reliability by preventing undesired bit flip and/or data read errors. Also, the heat sink region 539 can effectively reduce local thermal effects among cells due to heat accumulation that can result from continuous operation of a phase change memory device. In various embodiments, the heat sink region 539 can increase the quench rate associated with a reset pulse, e.g., reset pulse 311 shown in FIG. 3.

On a broader scale, the heat sink region 539 can also serve as a heat dissipater for a semiconductor chip that includes an array of phase change memory cells. As such, the heat sink region 539 can help to keep the chip cool. As an example, the heat sink region 539 associated with an array of phase change memory cells in accordance with embodiments described herein can dissipate heat from a chip more quickly and efficiently than previous approaches in which thermally non-conductive insulating materials are deposited between phase change memory cells, e.g., between stacks 521-1 and 521-2. Such thermally non-conductive insulating materials dissipate heat less quickly than thermally conductive materials. As such, heat produced by phase change memory cells according to previous approaches would be maintained in and around the cells for a longer time, which could increase thermal crosstalk between cells as well as increase the total temperature of the semiconductor chip.

In one or more embodiments, the thermally conductive material 539 has a thermal conductivity of at least 30 Watts/meter-Kelvin (W/m·K). In various embodiments, the material 539 has a thermal conductivity of at least 100 W/m·K. In one or more embodiments, the thermally conductive material 539 can be a thermally conductive insulative material or a combination of thermally conductive insulative materials such as SiN, DLC, AlN, carbon nanotubes, and/or various C-C composites, to name a few. The relatively high thermal conductivities of such thermally conductive dielectric materials can provide an efficient heat sink region between adjacent phase change memory cells.

In one or more embodiments, the thermally conductive material 539 can be a metal. In such embodiments, the dielectric encapsulation layer 537 can electrically isolate the metal heat sink region 539 from the first and second stacks 521-1 and 521-2. However, in embodiments in which the thermally conductive material 539 is not an electrically conductive material, such as a metal, the formation of the encapsulation layer 537 may be eliminated. That is, it may not be as useful to provide a dielectric layer 537 for electrically insulating the stacks 521-1 and 521-2 from each other when the thermally conductive material 539 is not itself electrically conductive.

As one of ordinary skill in the art will appreciate, subsequent processing steps in a fabrication sequence can be performed on the phase change memory structure 520 shown in FIG. 5C. For instance, although not shown in FIG. 5C, conductive contacts can be formed on the structure 520 to connect the top electrodes 533-1 and 533-2 to a bit line, which can be formed thereon, for example.

FIGS. 6A-6D are cross-sectional views illustrating formation of a phase change memory structure 620 in accordance with one or more embodiments of the present disclosure. The structure 620 described in FIGS. 6A-6D includes a portion of a number of phase change memory cells at various stages in a fabrication sequence.

Figure 6A:
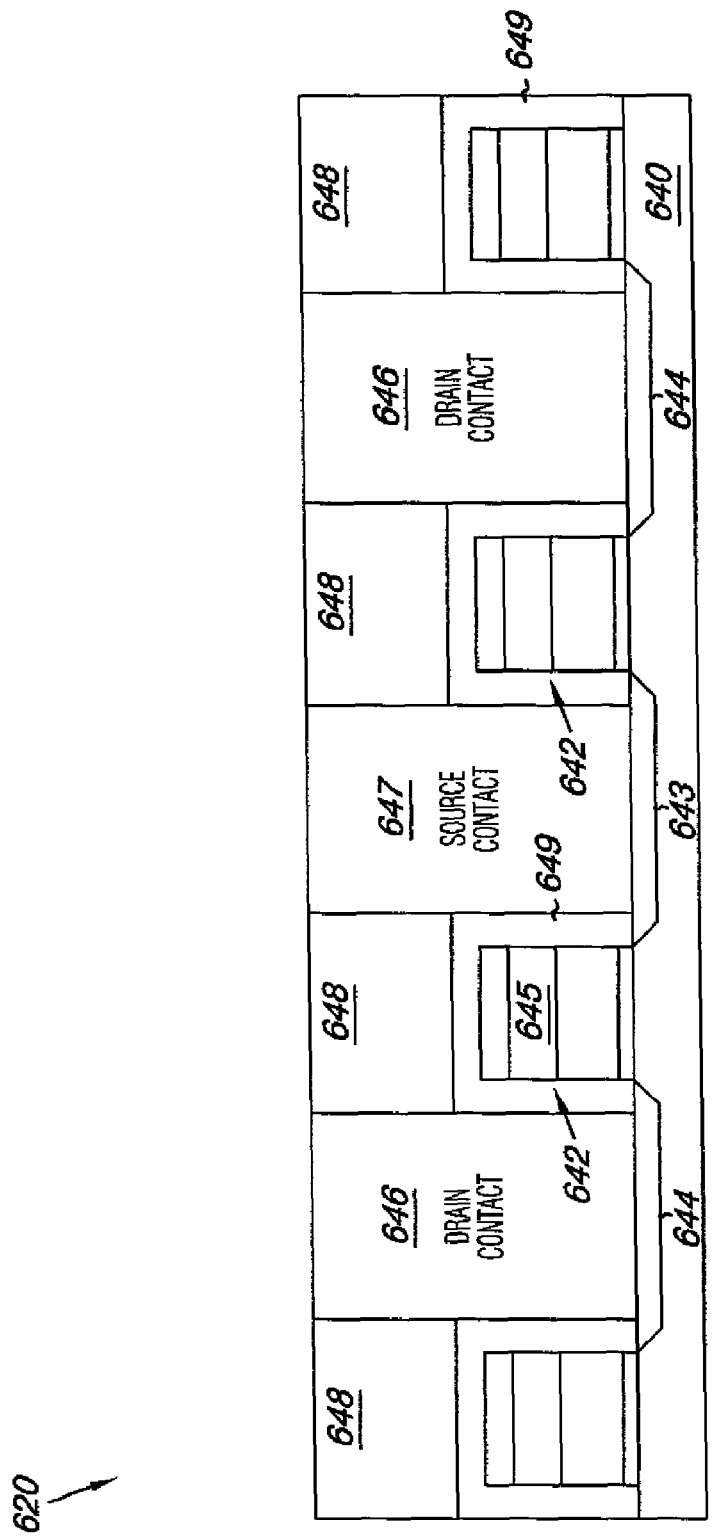
FIGS. 6A-6D are cross-sectional views illustrating formation of a phase change memory structure in accordance with one or more embodiments of the present disclosure.

FIG. 6A shows phase change structure 620 at a particular stage in a phase change memory device fabrication sequence. The embodiment illustrated in FIG. 6A includes a number of access devices 642 formed on a substrate 640. In the embodiment illustrated in FIGS. 6A-6D, the access devices 642 are MOSFET (metal oxide semiconductor field effect transistor) devices having associated source 643, drain 644, and gate 645 regions. However, embodiments are not limited to a particular type of access device. For instance, as described above, the access devices 642 can be diodes or BJTs, among other types of access devices for operating phase change memory cells.

As the reader will appreciate, the substrate 640 can be a silicon substrate foundation among various other semiconductor foundations such as SOI, SOS, etc. As an example, the substrate 640 can be a p-type semiconductor substrate with n-type source 643 and drain 644 regions.

The phase change memory structure 620 includes a source contact 647 and drain contacts 646. The source and drain contacts are connected to the respective source 643 and drain 644 regions of the structure 620 and can be metal contacts. A layer 649 is formed around the gate stacks of the transistors 642 to electrically insulate the transistors 642 from the contacts 646 and 647. As such, the layer 649 can be a dielectric material such as SiN, among various other dielectric materials.

The structure 620 includes a dielectric layer 648 formed over the transistors 642 and located between the source 647 and drain 646 contacts. The layer 648 can be a dielectric material such as silicon dioxide or other suitable dielectric material. The upper surface of the structure 620 shown in FIG. 6A can be planarized to expose the contacts 646 and 647 via CMP or other suitable planarization techniques. Alternatively, the layer 648 can be removed via CMP down to layer 649.

Figure 6B:
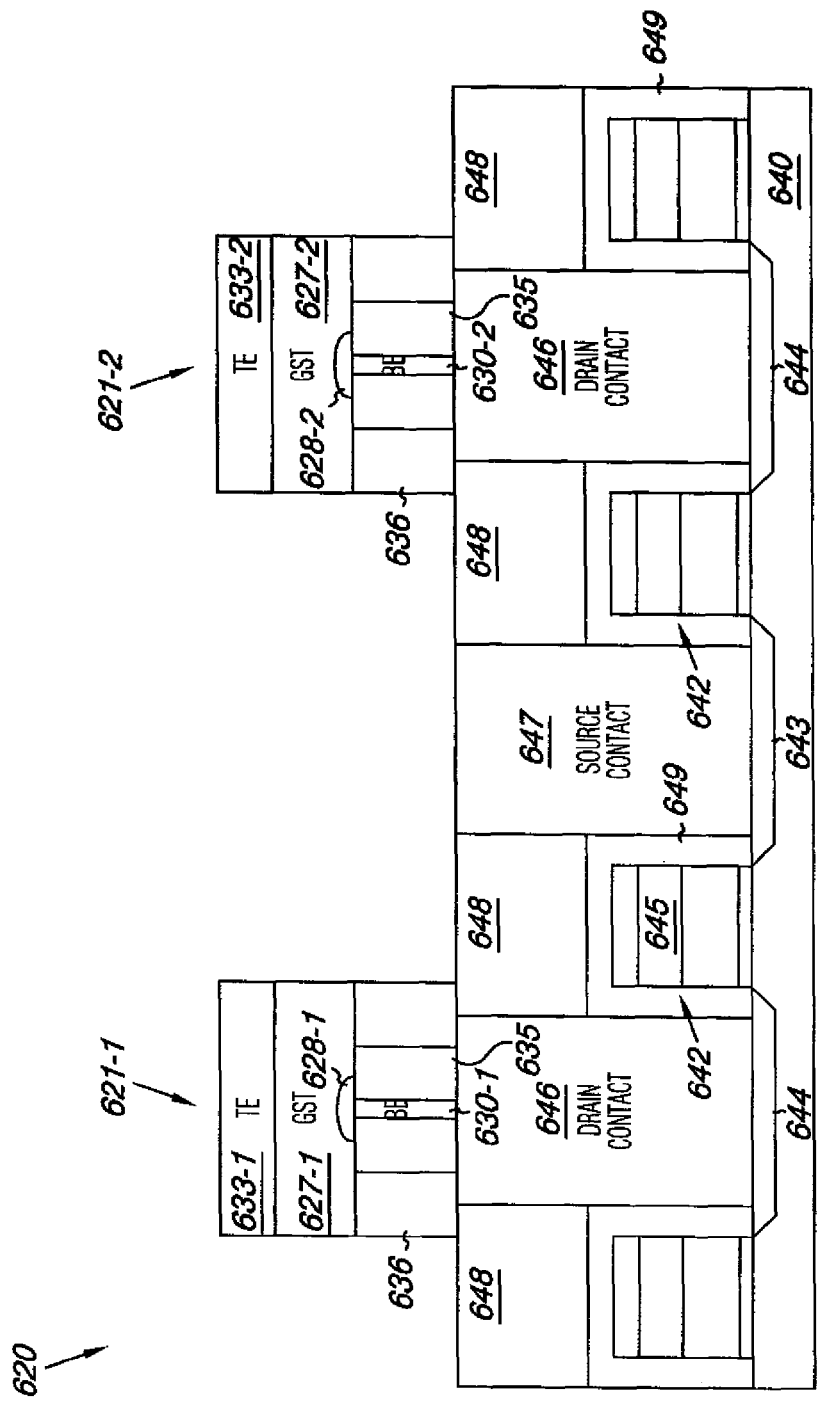

FIG. 6B shows phase change structure 620 at another particular stage in a phase change memory device fabrication sequence. The embodiment illustrated in FIG. 6B includes a first stack structure 621-1 associated with a first phase change memory cell and a second stack structure 621-2 located a distance from the first stack structure and associated with a second phase change memory cell, e.g., an adjacent cell in phase change array such as array 100 shown in FIG. 1.

As shown in the embodiment illustrated in FIG. 6B, the first stack 621-1 includes a top electrode (TE) 633-1 formed on a layer of phase change material 627-1 (GST in this example), which is formed on a dielectric layer 636. The second stack 621-2 includes a top electrode 633-2 formed on a layer of phase change material 627-2, which is formed on a dielectric layer 636. As described above in connection with FIGS. 5A-5C, the separate stacks 621-1 and 621-2 are formed by a masking and etching process through the appropriate layers, and the etching can be a dry etch or other suitable process.

As shown in FIG. 6B, the stack 621-1 includes a bottom electrode (BE) 630-1 and the stack 621-2 includes a bottom electrode 630-2. The bottom electrodes 630-1 and 630-2 are formed of electrically conductive material and are connected to a respective conductive contacts 646. The contacts 646 can be metal contacts. In the embodiment illustrated in FIG. 63, the bottom electrodes 630-1 and 630-2 are connected to a drain region 644 of a transistor access device 642 via a corresponding drain contact 646.

The stack structures 621-1 and 621-2 can be formed in a similar manner as the stack structures 521-1 and 521-2 described in FIGS. 5A-5C. For instance, a dielectric layer 636 can be formed on the planarized surface of the structure 620, i.e., over the contacts 646 and 647 and the dielectric layer 648. The dielectric layer 636 can be silicon dioxide or other suitable dielectric material.

The dielectric layer 636 can be masked and etched and then filled with portions 635 of material prior to formation of the bottom electrodes 630-1 and 630-2 therein. However, embodiments are not limited to this example. For instance, in various embodiments, the bottom electrodes 630-1 and 630-2 may be formed directly in dielectric layer 636. That is, in such embodiments, the filler material 635 may not be used in forming the bottom electrodes. Whether the filler material is used can depend on various factors such as the desired width of the electrodes 630-1 and 630-2, among other factors.

After formation of the bottom electrodes 630-4 and 630-2, a layer of phase change material, e.g., a chalcogenide alloy such as GST or other suitable phase change material, is formed on the dielectric layer 636 and a layer of conductive material which will form top electrodes 633-1 and 633-2 is formed over the phase change material layer. As noted above in connection with the embodiment shown in FIGS. 5A-5C, a masking and etching process can then be used to remove the appropriate portions of structure 620 in order to form the individual stacks 621-1 and 621-2 corresponding to adjacent phase change memory cells.

As illustrated in FIG. 6B, the first stack 621-1 includes phase change material 627-1 located between and connected to the bottom electrode 630-1 and the top electrode 633-1. The second stack 621-2 includes phase change material 627-2 located between and connected to the bottom electrode 630-2 and the top electrode 633-2. In the embodiment shown in FIG. 6B, the phase change materials 627-1 and 627-2 include respective portions 628-1 and 628-2, which can undergo structural phase transitions during operation of the phase change memory cells.

Figure 6C:
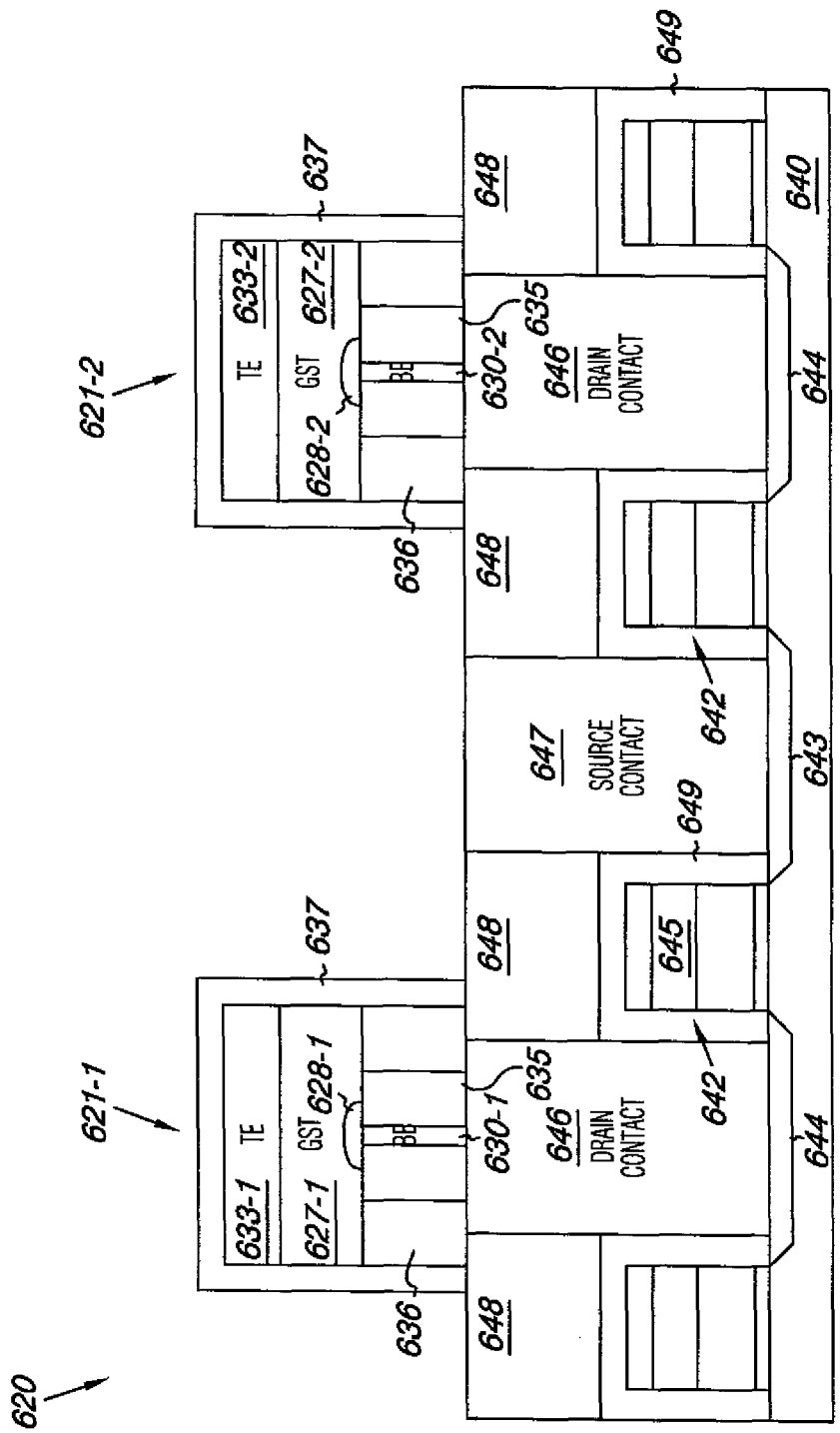

FIG. 6C shows phase change structure 620 at another particular stage in a phase change memory device fabrication sequence. In the embodiment illustrated in FIG. 6C, an encapsulation layer 637 is formed on the structure 620. The encapsulation layer 637 can be a dielectric material, which can be used to electrically insulate the stack 621-1 associated with a first phase change memory cell from the stack 621-2 associated with an adjacent phase change memory cell. As shown in FIG. 6C, the layer 637 can form sidewalls on the stacks 621-1 and 621-2. The layer 637 can be an insulating material such as silicon nitride (SiN), polyimide, or fluorinated silicon dioxide, among other insulators, and can be deposited via a process such as chemical vapor deposition (CVD). However, embodiments are not limited to particular materials or to particular formation, e.g., deposition and/or growth, techniques. Subsequent to the formation of the layer 637, a spacer etch can be performed to remove excess material from between the stacks 621-1 and 621-2 in order to expose the surface of source contact 647, as shown in FIG. 6C.

Figure 6D:
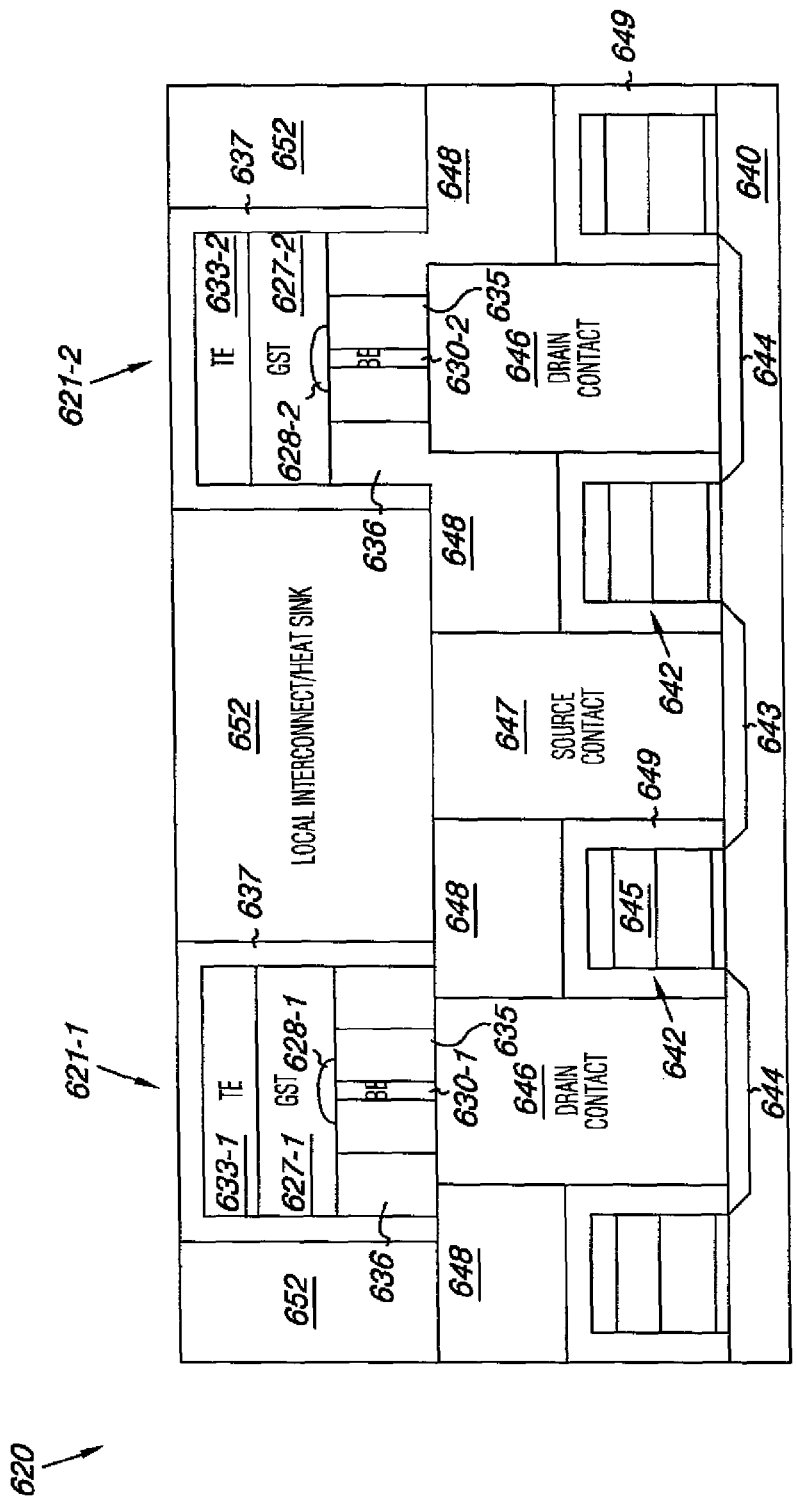

FIG. 6D shows the phase change structure 620 at another particular stage in a phase change memory device fabrication sequence. In FIG. 6D, the structure 620 includes a thermally conductive material 652 deposited between adjacent phase change memory cells, e.g., in the gap between adjacent stack structures 621-1 and 621-2, and over at least a portion of the source contact 647, such that at least a portion of the material 652 is in direct contact with the source contact 647.

In one or more embodiments of the present disclosure, the thermally conductive material 652 provides a heat dissipation region, e.g., a heat sink, between and/or around adjacent phase change memory cells. The heat sink region 652 (shown as "LOCAL INTERCONNECT/HEAT SINK") can quickly and efficiently dissipate heat generated by a particular cell, which can reduce thermal crosstalk between adjacent cells. Reduction in thermal crosstalk between phase change memory cells can include benefits such as improving data reliability by preventing undesired bit flip and/or data read errors.

In the embodiment illustrated in FIG. 6D, the heat sink material 652 is an electrically conductive material, e.g., a metal, such that the region 652 can serve as a local interconnect between portions of a phase change memory device due to its electrically conductive properties. That is, the heat sink material can be both thermally and electrically conductive. As such, the metal heat sink region 652 can provide a local interconnect as well as provide improved heat dissipation properties over previous phase change memory structures.

As an example, the region 652 can serve as a reference contact, e.g., a ground interconnect, to the source region 643 via source contact 647. The heat sink/local interconnect region 652 can help to keep a semiconductor chip cool by rapidly dissipating heat generated by operation of an array of phase change memory cells more efficiently than previous approaches in which thermally non-conductive insulating materials are deposited in the gap between phase change memory cells, e.g., between stacks 621-1 and 621-2.

In various embodiments, the heat sink/local interconnect region 652 can increase the quench rate associated with a reset pulse, e.g., reset pulse 311 shown in FIG. 3. That is, the heat dissipation provided by the region 652 can decrease the time it takes for a phase change cell to be reset.

One or more embodiments of the present disclosure can reduce the complexity of previous fabrication processes by reducing the number of process steps associated with forming phase change memory structures. As an example, using the heat sink region 652 as a local interconnect, such as shown in the embodiment of FIG. 6D, can eliminate a number of processing steps associated with forming one or more local interconnect regions. For instance, in previous approaches in which a thermally non-conductive dielectric material is formed in the gap between cells, e.g., as illustrated in FIG. 4, the electrically conductive local interconnects would be formed in a number of additional processing steps. That is, in previous approaches, additional processing steps would be utilized, e.g., deposition, masking, and etching of metallization layers would be performed to create one or more local interconnects.

The material 652 can be various metals such as tungsten or copper, among various other metals, metal silicides, and/or suitable electrical conductors. In one or more embodiments, the material 652 can have a thermal conductivity of at least 30 Watts/meter-Kelvin (W/m·K). In various embodiments, the material 652 has a thermal conductivity of at least 100 W/m·K.

As one of ordinary skill in the art will appreciate, subsequent processing steps in a fabrication sequence can be performed on the phase change memory structure 620 shown in FIG. 6D. For instance, although not shown in FIG. 6D, conductive contacts can be formed on the structure 620 to connect the top electrodes 633-1 and 633-2 to a bit line of the phase change memory cells array, e.g., array 100 shown in FIG. 1, for instance.

Figure 7:
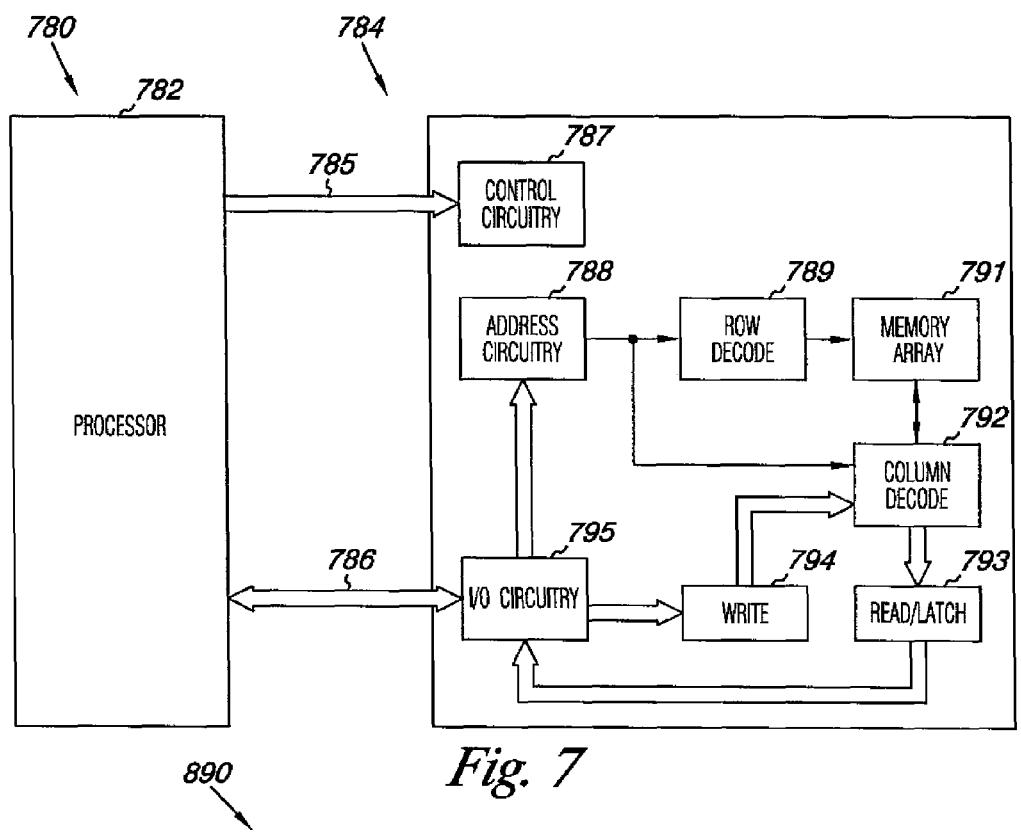
FIG. 7 is a functional block diagram of an electronic memory system having at least one memory device in accordance with an embodiment of the present disclosure.

FIG. 7 is a functional block diagram of an electronic memory system 780 having at least one memory device in accordance with an embodiment of the present disclosure. Memory system 780 includes a processor 782 coupled to a non-volatile memory device 784 that includes a memory array 791 of phase change memory cells, e.g., phase change array 100 described in connection with FIG. 1 and phase change array 200 described in connection with FIG. 2. The memory system 780 can include separate integrated circuits or both the processor 782 and the memory device 784 can be on the same integrated circuit. The processor 782 can be a microprocessor or some other type of controlling circuitry such as an application-specific integrated circuit (ASIC).

The array 791 of phase change memory cells can be organized according to various architectures known in the art. As an example, the access devices of each row of memory cells are coupled with a word line, while phase change memory elements of the memory cells are coupled to bit lines.

The embodiment of FIG. 7 includes address circuitry 788 to latch address signals provided over I/O connections 786 through I/O circuitry 795. Address signals are received and decoded by a row decoder 789 and a column decoder 792 to access the memory array 791.

The memory array 791 can include phase change memory cell structures according to embodiments described herein. The memory device 784 reads data in the memory array 791 by sensing voltage and/or current changes in the memory array columns using sense/buffer circuitry that in this embodiment can be read/latch circuitry 793. The read/latch circuitry 793 can be coupled to read and latch data from the memory array 791. I/O circuitry 795 is included for bi-directional data communication over the I/O connections 786 with the processor 782. Write circuitry 794 is included to write data to the memory array 791.

Control circuitry 787 decodes signals provided by control connections 785 from the processor 782. These signals can include chip signals, write enable signals, and address latch signals that are used to control the operations on the memory array 791, including data read, data write, and data erase operations. In various embodiments, the control circuitry 787 is responsible for executing instructions from the processor 782 to perform the operating and programming embodiments of the present disclosure. The control circuitry 787 can be a state machine, a sequencer, or some other type of controller. It will be appreciated by those skilled in the art that circuitry and/or signals in addition to those shown in FIG. 7 can be provided.

Figure 8:
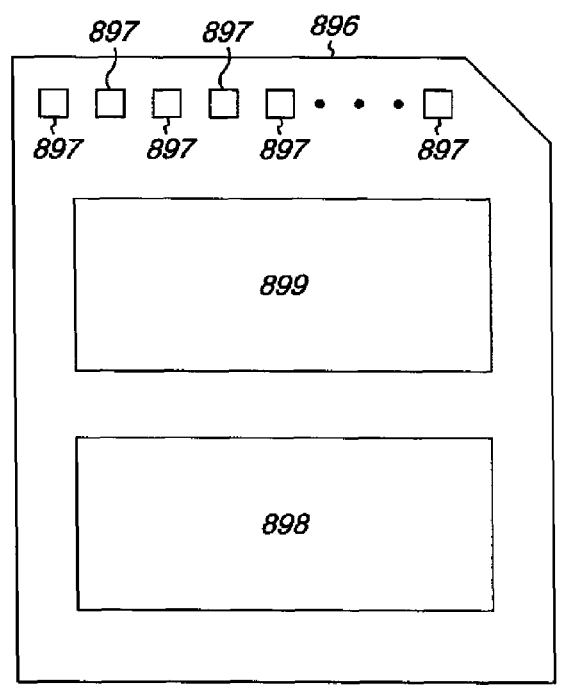
FIG. 8 is a functional block diagram of a memory module having at least one memory device in accordance with an embodiment of the present disclosure.

FIG. 8 is a functional block diagram of a memory module 890 having at least one memory device in accordance with an embodiment of the present disclosure. Memory module 890 is illustrated as a memory card, although the concepts discussed with reference to memory module 890 are applicable to other types of removable or portable memory (e.g., USB PCRAM drives) and are intended to be within the scope of "memory module" as used herein. In addition, although one example form factor is depicted in FIG. 8, these concepts are applicable to other form factors as well.

In some embodiments, memory module 890 will include a housing 896 (as depicted) to enclose one or more memory devices 898, though such a housing is not essential to all devices or device applications. At least one memory device 898 includes an array of phase change memory cells according to embodiments described herein. Where present, the housing 896 includes one or more contacts 897 for communication with a host device. Examples of host devices include digital cameras, digital recording and playback devices, PDAs, personal computers, memory card readers, interface hubs and the like.

For some embodiments, the contacts 897 are in the form of a standardized interface. For example, with a USB PCRAM drive, the contacts 897 might be in the form of a USB Type-A male connector. For some embodiments, the contacts 897 may be in the form of a semi-proprietary interface. In general, however, contacts 897 provide an interface for passing control, address and/or data signals between the memory module 890 and a host having compatible receptors for the contacts 897.

The memory module 890 may optionally include additional circuitry 899, which may be one or more integrated circuits and/or discrete components. For some embodiments, the additional circuitry 899 may include a memory controller for controlling access across multiple memory devices 898 and/or for providing a translation layer between an external host and a memory device 898. For example, there may not be a one-to-one correspondence between the number of contacts 897 and a number of connections to the one or more memory devices 898. Thus, a memory controller could selectively couple an I/O connection (not shown in FIG. 8) of a memory device 898 to receive the appropriate signal at the appropriate I/O connection at the appropriate time or to provide the appropriate signal at the appropriate contact 897 at the appropriate time.

Similarly, the communication protocol between a host and the memory module 890 may be different than what is required for access of a memory device 898. A memory controller could then translate the command sequences received from a host into the appropriate command sequences to achieve the desired access to the memory device 898. Such translation may further include changes in signal voltage levels in addition to command sequences.

The additional circuitry 899 may further include functionality unrelated to control of a memory device 898 such as logic functions as might be performed by an ASIC. Also, the additional circuitry 899 may include circuitry to restrict read or write access to the memory module 890, such as password protection, biometrics or the like.

The additional circuitry 899 may include circuitry to indicate a status of the memory module 890. For example, the additional circuitry 899 may include functionality to determine whether power is being supplied to the memory module 890 and whether the memory module 890 is currently being accessed, and to display an indication of its status, such as a solid light while powered and a flashing light while being accessed. The additional circuitry 899 may further include passive devices, such as decoupling capacitors to help regulate power requirements within the memory module 890.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. A phase change memory cell, comprising:
   a stack structure including a phase change material in contact with a first electrode and a second electrode; and
   a heat sink comprised of a thermally conductive material located between a stack structure associated with an adjacent phase change memory cell;

wherein the heat sink is formed over a metal contact coupled to at least one of a source region and a drain region associated with an access transistor corresponding to the phase change memory cell.

2. The memory cell of claim 1, including a dielectric material formed on a first sidewall of the stack structure and on a first sidewall of the stack structure associated with the adjacent phase change memory cell.

3. The memory cell of claim 2, wherein the dielectric material is a continuous encapsulation layer formed over the stack structure and the stack structure associated with the adjacent phase change memory cell.

4. The memory cell of claim 3, wherein the heat sink is located in a gap formed by the continuous encapsulation layer.

5. The memory cell of claim 1, wherein a thermal conductivity of the thermally conductive material is at least 30 W/m·K.

6. The memory cell of claim 1, wherein a thermal conductivity of the thermally conductive material is at least 100 W/m·K.

7. The memory cell of claim 1, wherein the heat sink is comprised of a metal.

8. A phase change memory cell, comprising:
a first, a second, and a third metal contact formed on a substrate, the third metal contact located between the first and second metal contact;
a first stack structure formed a distance from a second stack structure, the first and the second stack structures including a phase change material in contact with a first electrode and a second electrode, wherein the first electrode of the first stack is coupled to the first metal contact and the first electrode of the second stack is coupled to the second metal contact;
a dielectric material formed on a wall of the first and the second stack structure; and
a heat sink material formed in a gap between the first stack structure and the second stack structure.

9. The memory cell of claim 8, wherein the heat sink material is formed over at least a portion of the third metal contact.

10. The memory cell of claim 8, wherein the first electrode is a bottom electrode and the second electrode is a top electrode.

11. The memory cell of claim 8, wherein at least one of the first and the second metal contact is a drain contact coupled to a drain region associated with the substrate.

12. The memory cell of claim 8, wherein the third metal contact is a source contact coupled to a source region associated with the substrate.

13. The memory cell of claim 8, including a gate of an access transistor formed between the first and the third metal contact.

14. The memory cell of claim 8, wherein the dielectric material formed on the wall of the first and the second stack structure is also formed over the third metal contact.

15. A phase change memory cell, comprising:
a first stack structure formed including a phase change material between a bottom electrode and a top electrode;
a first metal contact coupled to the bottom electrode and to an access device corresponding to the memory cell;
a heat sink material located between the first stack structure and a second stack structure corresponding to an adjacent phase change memory cell; and
a second metal contact coupled to the heat sink material and to the access device corresponding to the memory cell.

16. The memory cell of claim 15, wherein first metal contact is a drain contact and the second metal contact is a source contact.

17. The memory cell of claim 15, wherein the heat sink material is coupled to a dielectric material formed on at least a sidewall of the first stack structure and at least a sidewall of the second stack structure.

18. The memory cell of claim 15, wherein the heat sink material has a thermal conductivity of at least 30 W/m·K.

* * * * *